United States Patent
Miyata et al.

[19]

[11] Patent Number: 5,885,891
[45] Date of Patent: Mar. 23, 1999

[54] METHOD OF MANUFACTURING SEMICONDUCTOR DEVICE

[75] Inventors: Masahiro Miyata, Urayasu; Hirokazu Ezawa, Tokyo, both of Japan

[73] Assignee: Kabushiki Kaisha Toshiba, Kawasaki, Japan

[21] Appl. No.: 895,104

[22] Filed: Jul. 16, 1997

[30] Foreign Application Priority Data

Jul. 17, 1996 [JP] Japan ................................ 8-187470

[51] Int. Cl.⁶ .................................................. H01L 21/44
[52] U.S. Cl. ......................... 438/612; 438/612; 438/614
[58] Field of Search ............................. 438/612, 613, 438/614, 615

[56] References Cited

U.S. PATENT DOCUMENTS

| | | | |
|---|---|---|---|
| 4,948,754 | 8/1990 | Kondo et al. | 438/613 |
| 4,950,623 | 8/1990 | Dishon | 438/615 |
| 5,048,744 | 9/1991 | Chang et al. | 438/612 |
| 5,137,845 | 8/1992 | Lochen et al. | 438/615 |
| 5,162,257 | 11/1992 | Yung | 438/613 |
| 5,268,072 | 12/1993 | Agarwala et al. | 438/615 |
| 5,773,359 | 6/1998 | Mitchell et al. | 438/614 |

*Primary Examiner*—Kevin M. Picardat
*Attorney, Agent, or Firm*—Finnegan, Henderson, Farabow, Garrett & Dunner, L.L.P.

[57] ABSTRACT

Disclosed is a method of manufacturing a semiconductor device, comprising the step of forming a pad electrode on an insulating film covering a semiconductor substrate, the step of forming a first metal layer on the pad electrode, the first metal layer being capable of forming a strong adhesive bond with the pad layer, followed by forming a second metal layer on the first metal layer, the second metal layer acting as a barrier layer and being capable of forming a strong adhesive bond with a solder, the step of forming a resist pattern on the second metal layer in a manner to cover that region which corresponds to the pad electrode, the step of etching the second metal layer using the resist pattern as a mask, the step of removing the resist pattern, the step of forming a solder layer selectively on the second metal layer, and the step of selectively etching the first metal layer using the solder layer as a mask.

23 Claims, 8 Drawing Sheets

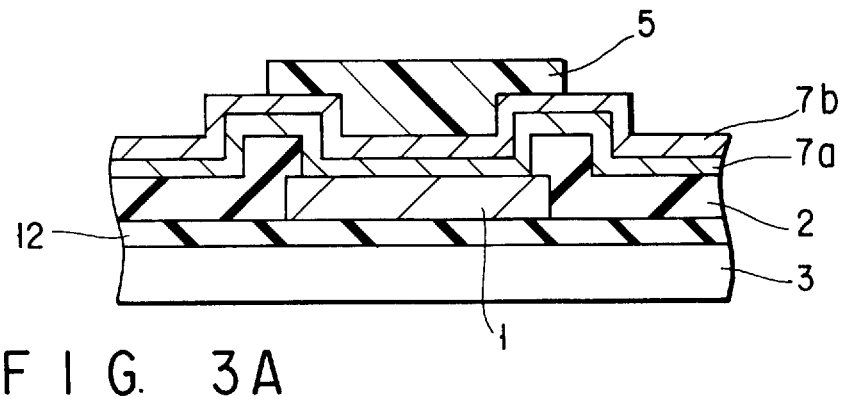
F I G. 3A
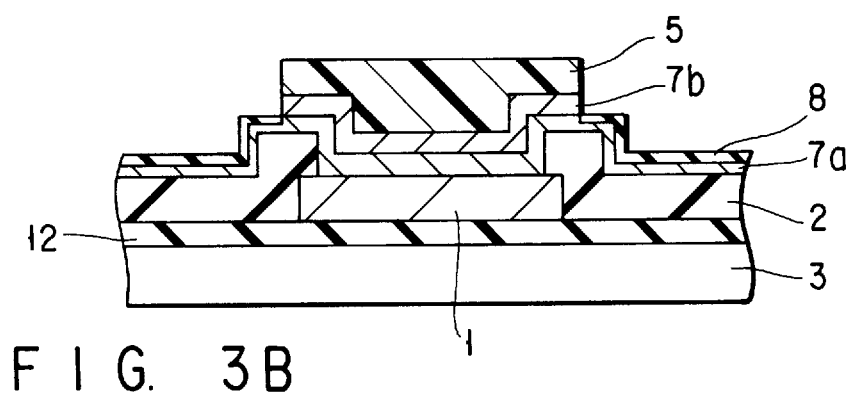
F I G. 3B
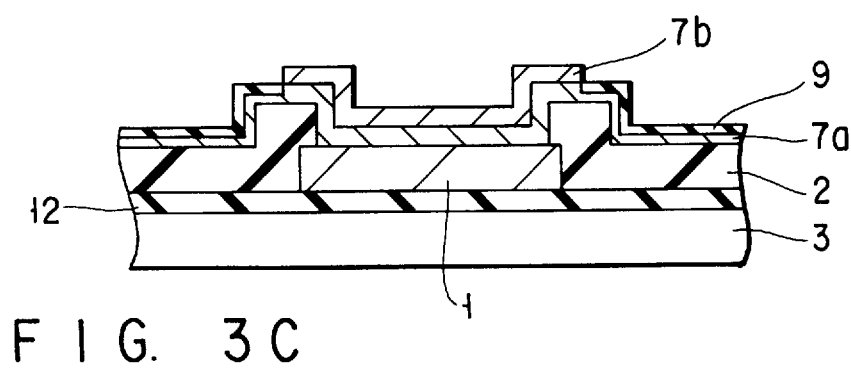
F I G. 3C

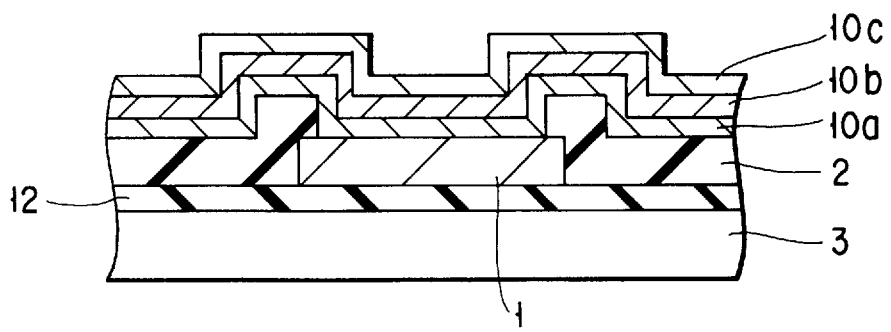
F I G. 4A
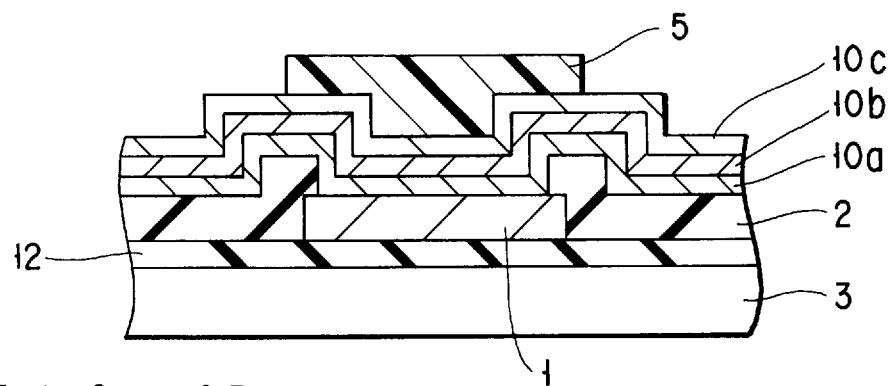
F I G. 4B
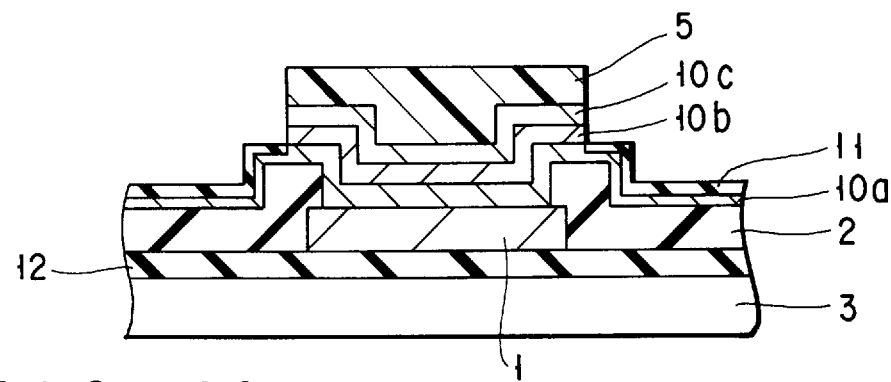
F I G. 4C

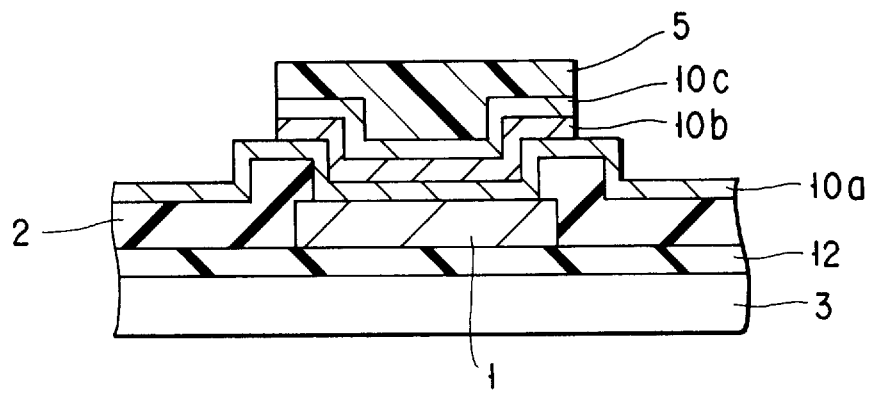
F I G. 5A
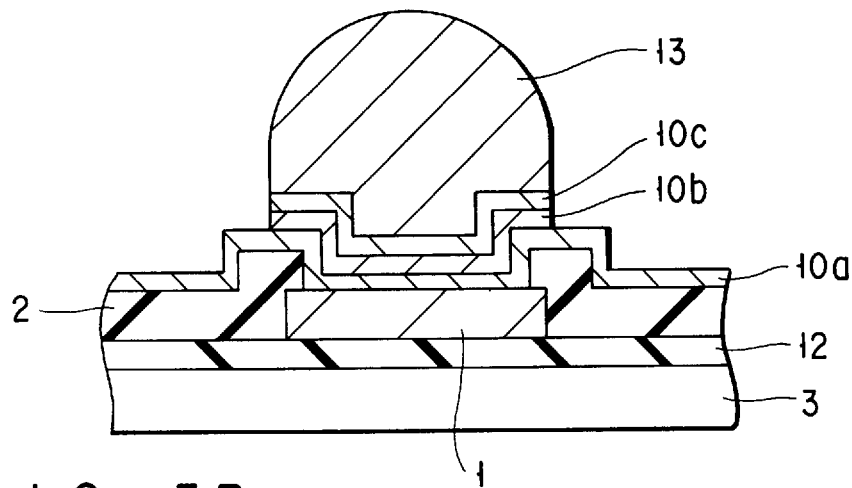
F I G. 5B
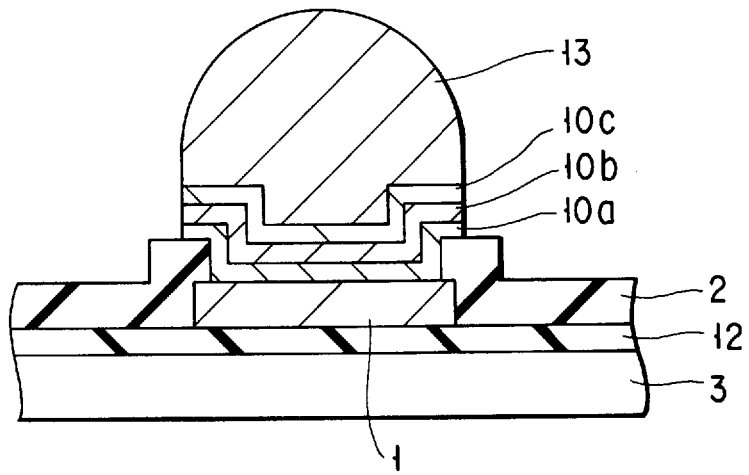
F I G. 5C

METHOD OF MANUFACTURING SEMICONDUCTOR DEVICE

BACKGROUND OF THE INVENTION

The present invention relates to a method of manufacturing a semiconductor device, particularly, to a method of forming a solder bump electrode.

FIGS. 1A to 1D collectively show a conventional method of forming a bump electrode for a semiconductor device. As shown in the drawings, a pad electrode 1 made of, for example, aluminum is formed on an insulating film 12 covering the surface of a semiconductor substrate 3, followed by depositing an insulating protective film 2 on the entire surface. Then, that portion of the insulating protective film 2 which is positioned on the pad electrode 1 is selectively removed to form an opening exposing the pad electrode 1 to the outside.

Then, metal layers 4, which act as current supply layers in the solder plating step and as barrier layers after the solder plating step, are consecutively formed by a sputtering method on the entire surface, as shown in FIG. 1A. In general, the metal layers 4 are of a laminate structure consisting of three layers 4a, 4b and 4c. The lowermost layer 4a, which is made of, for example, Ti, is in direct contact with the pad electrode 1, i.e., Al layer, to form a strong adhesive bond with the Al layer. The intermediate layer 4b, which is made of Ni or Cu, acts as a barrier layer. Further, the uppermost layer 4c, which is made of a noble metal such as Pd or Pt, serves to form a strong adhesive bond with a solder layer which is to be formed thereon in the subsequent step and also acts as an anti-oxidation film.

In the next step, the entire surface is coated with a resist layer 5, followed by patterning the resist layer 5 by means of the ordinary photolithography technology so as to form an opening above the pad electrode 1, as shown in FIG. 1B. Then, an electroplating of solder is applied to form a solder bump 6 in the opening positioned above the pad electrode 1, as shown in FIG. 1C. After formation of the solder bump 6, the resist layer 5 is removed. Then, the metal layers 4 are etched using the solder bump 6 as a mask, as shown in FIG. 1D, thereby to prepare a semiconductor device comprising a solder bump electrode.

In the conventional method outlined above, the semiconductor device including the resist layer 5 is dipped in the plating bath in the step of forming the solder bump by the electroplating method. In general, the plating bath is strongly acidic, with the result that the resist layer 5 is partly dissolved during the plating step into the plating bath to form organic impurities. It follows that it is impossible to maintain as desired the composition of the plating bath. It is most important to control the composition of the plating bath in the electroplating. However, it is very difficult to maintain as desired the composition of the plating bath in the conventional method because organic impurities unavoidably enter the plating bath, as pointed out above.

Further, the uppermost metal layer 4c is made of a noble metal such as Pd or Pt, and the intermediate metal layer 4b is made of, for example, Ni or Cu in the conventional technique as already pointed out. What should be noted is that it is difficult to remove Pd, Pt, Au, Ni, Cu, etc. by a dry etching in the etching step for removing the metal layers 4 after formation of the solder bump 6. Therefore, the metal layers 4 are removed by a wet etching using an etching solution exhibiting an oxidizing power in the conventional method. However, each of Pb and Sn constituting the main components of the solder tend to be corroded easily by the etching solution exhibiting an oxidizing power. It follows that the solder bump 6 is also damaged in the etching step for removing the metal layers 4, leading to a low yield and a low reliability of the resultant semiconductor device.

BRIEF SUMMARY OF THE INVENTION

An object of the present invention is to provide a method of manufacturing a semiconductor device, which permits preventing organic impurities from entering a solder plating bath and also permits preventing a solder bump from being damaged in the etching step of the metal layer so as to prolong the life of the solder plating bath and to improve the yield and reliability of the solder bump electrode included in the resultant semiconductor device.

According to an aspect of the present invention, there is provided a method of manufacturing a semiconductor device, comprising the steps of:

forming a pad electrode on an insulating film covering a semiconductor substrate;

forming a first metal layer on the pad electrode, the first metal layer being capable of forming a strong adhesive bond with the pad layer, followed by forming a second metal layer on the first metal layer, the second metal layer acting as a barrier layer and being capable of forming a strong adhesive bond with a solder;

forming a resist pattern on the second metal layer in a manner to cover that region which corresponds to the pad electrode;

etching the second metal layer using the resist pattern as a mask;

removing the resist pattern;

forming a solder layer selectively on the second metal layer; and selectively etching the first metal layer using the solder layer as a mask.

According to another aspect of the present invention, there is provided a method of manufacturing a semiconductor device, comprising the steps of:

forming a pad electrode on an insulating film covering a semiconductor substrate;

forming a first metal layer on the pad electrode, the first metal layer being capable of forming a strong adhesive bond with the pad layer, followed by forming a second metal layer on the first metal layer, the second metal layer acting as a barrier layer and being capable of forming a strong adhesive bond with a solder;

forming a resist pattern on the second metal layer in a manner to cover that region which corresponds to the pad electrode;

successively etching the second metal layer and the first metal layer using the resist pattern as a mask;

removing the resist pattern; and selectively forming a solder layer on the second metal layer.

According to another aspect of the present invention, there is provided a method of manufacturing a semiconductor device, comprising the steps of:

forming a pad electrode on an insulating film covering a semiconductor substrate;

forming a first metal layer on the pad electrode, the first metal layer being capable of forming a strong adhesive bond with the pad layer, followed by forming a second metal layer on the first metal layer, the second metal layer acting as a barrier layer and being capable of forming a strong adhesive bond with a solder;

forming a resist pattern on the second metal layer in a manner to cover that region which corresponds to the pad electrode;

etching the second metal layer using the resist pattern as a mask;

removing the resist pattern;

forming a solder layer selectively on the second metal layer by means of a printing method; and etching the first metal layer.

Further, according to still another aspect of the present invention, there is provided a method of manufacturing a semiconductor device, comprising the steps of:

forming a pad electrode on an insulating film covering a semiconductor substrate;

forming a first metal layer on the pad electrode, the first metal layer being capable of forming a strong adhesive bond with the pad layer, followed by forming a second metal layer on the first metal layer, the second metal layer acting as a barrier layer and being capable of forming a strong adhesive bond with a solder;

forming a resist pattern on the second metal layer in a manner to cover that region which corresponds to the pad electrode;

successively etching the second metal layer and the first metal layer using the resist pattern as a mask;

removing the resist pattern; and forming a solder layer selectively on the second metal layer by means of a printing method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3C are cross sectional views collectively showing a method of forming a bump electrode according to a second embodiment of the present invention;

FIGS. 4A to 4F are cross sectional views collectively showing a method of forming a bump electrode according to a third embodiment of the present invention;

FIGS. 5A to 5C are cross sectional views collectively showing a method of forming a bump electrode according to a fourth embodiment of the present invention.

DETAILED DESCRIPTION OF THE INVENTION

Figure 1A:
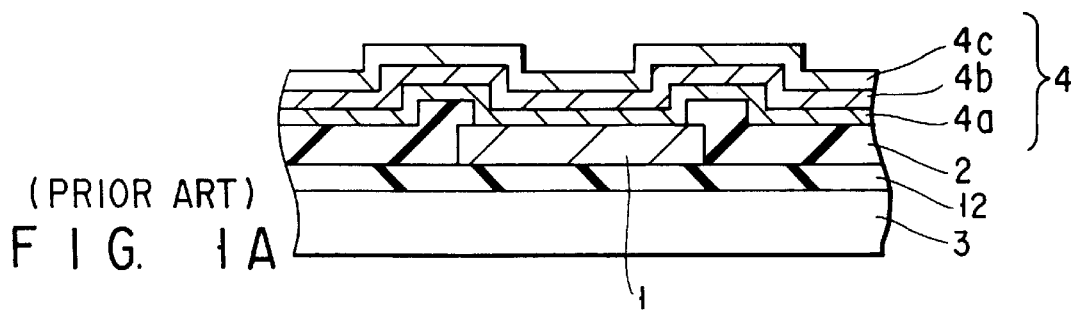
FIGS. 1A to 1D are cross sectional views collectively showing a conventional method of forming a bump electrode.
Figure 1B:
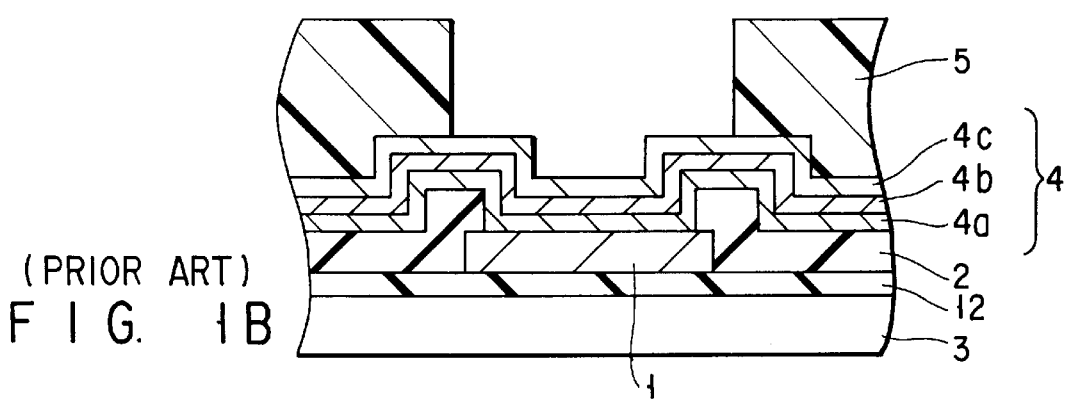
Figure 1C:
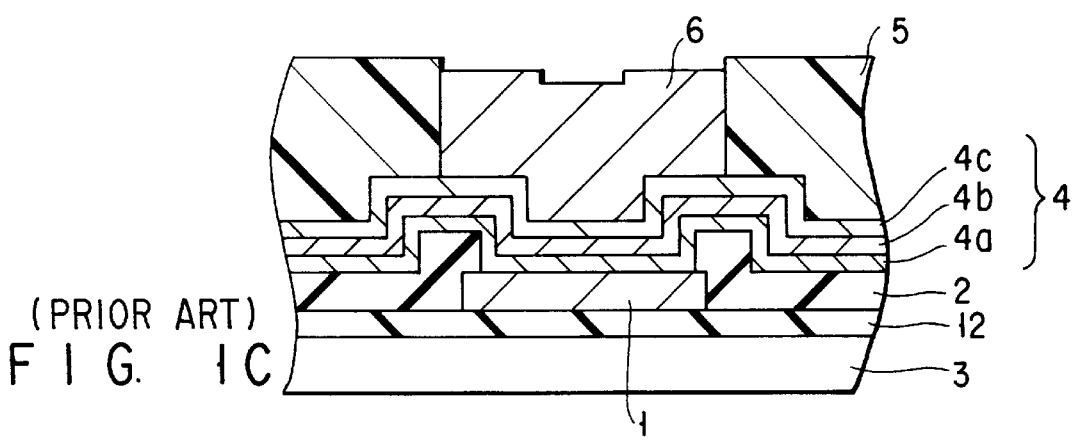
Figure 1D:
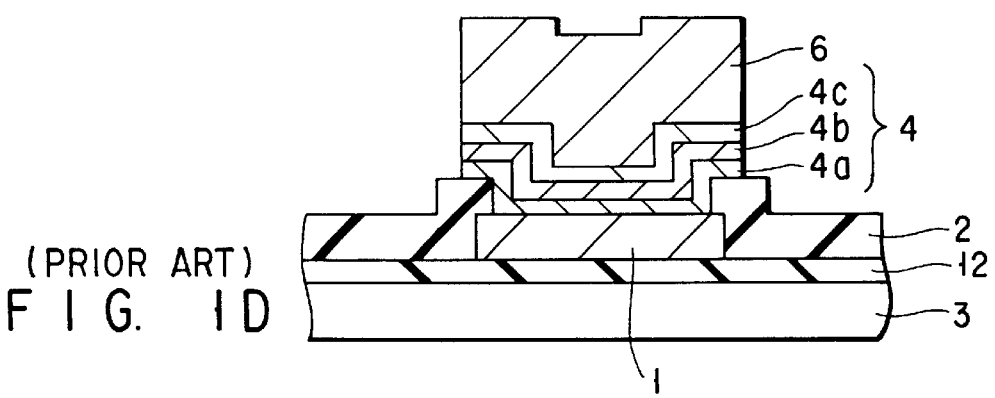

In the method of the present invention, a first metal layer capable of forming a strong adhesive bond with a pad electrode is formed on the pad electrode formed on a semiconductor electrode, followed by forming a second metal layer capable of forming a strong adhesive bond with a solder and acting as a barrier layer and subsequently forming the solder layer on the second metal layer. In removing these first and second metal layers, it was customary in the past to employ etching using the solder layer as a mask. In the present invention, however, the second metal layer is patterned in advance using a resist layer as a mask, followed by removing the resist layer and subsequently forming a solder layer selectively on the second metal layer.

What should be noted is that, in the present invention, the resist layer is already removed before formation of the solder layer by an electroplating. Naturally, it is unnecessary to worry about the mixing of organic impurities derived from the resist layer in the plating bath. It follows that the composition of the plating bath can be maintained as desired. What should also be noted is that, since the second metal layer is removed by etching using the resist layer, not the solder layer, as a mask, no damage is done to the solder layer even if an etching solution having an oxidizing power is used for etching the second metal layer.

Either a plating method or a printing method can be employed in the present invention for forming the solder layer. Also, the plating method employed in the present invention includes both an electroplating and an electroless plating, though it is desirable to employ an electroplating method for achieving a selective plating with a high accuracy. In the case of employing an electroplating, it is necessary for the first metal layer to be present in the plating step in order to achieve an electrical connection to a power source. Therefore, the second metal layer alone should be etched using the resist layer as a mask, and the first metal layer should not be etched in this step. Incidentally, the first metal layer is etched after formation of the solder layer using the solder layer as a mask.

Where the solder layer is formed selectively on the second metal layer by an electroplating, it is necessary for the region other than the second metal layer to be formed of an insulating material. In general, a wet etching using an etching solution exhibiting a strong oxidizing power is used for etching the second metal layer, with the result that the exposed surface of the first metal layer is oxidized to form an insulating layer. Incidentally, the surface of the first metal layer is easily oxidized, even if the etching solution used does not exhibit a particularly strong oxidizing power. As a matter of fact, the surface of the first metal layer is easily oxidized to form an insulating layer, if the first metal layer is simply exposed to the air. Therefore, it is possible to employ a dry etching, in place of the wet etching for etching the second metal layer. This is also the case with the etching of the first metal layer.

Where an electroless plating is employed for forming the solder layer, the second metal layer and the first metal layer can be removed by etching using the resist layer as a mask. Alternatively, the second metal layer alone should be etched using the resist layer as a mask, followed by forming the solder layer and subsequently etching the first metal layer using the solder layer as a mask, as in the case of employing the electroplating method.

A printing method disclosed in, for example, UK 2,274, 353 can also be employed for forming the solder layer. The UK specification is herein incorporated by reference. In the case of employing the printing method, it is not absolutely necessary to form the solder layer accurately on the second metal layer alone. In other words, a slight deviation is acceptable. Specifically, a reflow treatment is applied in the subsequent step. As a result, that portion of the solder layer which fails to be positioned accurately on the second metal layer is caused to move by the surface tension of the solder and a good wettability between the solder and the second metal layer so as to permit the particular portion of the solder to be positioned accurately on the second metal layer.

Where the solder layer is formed by a printing method, the first metal layer may be etched by using the resist layer as a mask after etching of the second metal layer. Alternatively, the first metal layer may be etched using the solder layer as a mask after formation of the solder layer.

In the present invention, the first metal layer may be formed of Ti. The thickness of the first metal layer may desirably fall within a range of between 50 and 500 mm. On the other hand, the second metal layer may be formed of a metal selected from the group consisting of Ni and Cu. The thickness of the second metal layer may desirably fall within a range of between 200 and 500 mm in the case of Ni, and between 1,000 and 3,000 nm in the case of Cu. Alternatively, the second metal layer may be of a laminate structure comprising a first sub-layer formed of a metal selected from the group consisting of Ni and Cu and a second sub-layer formed of a metal selected from the group consisting of Pd, Pt, and Au.

The solder used in the present invention is not particularly limited. It is possible to use various solders including, for example, a Pd—Sn eutectic solder, a Ag—Sn-based solder, an In-based solder, and a high-melting-point solder.

Figure 2A:
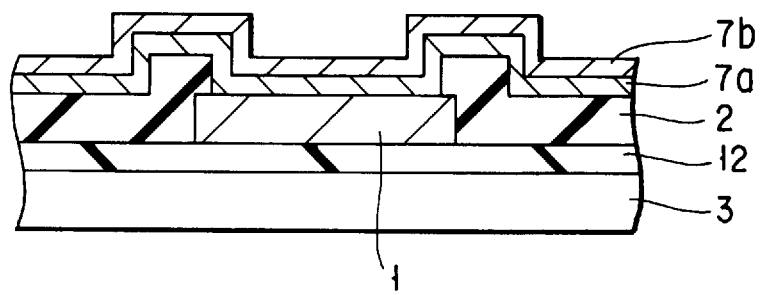
FIGS. 2A to 2G are cross sectional views collectively showing a method of forming a bump electrode according to a first embodiment of the present invention.

Let us describe some embodiments of the present invention with reference to the accompanying drawings. First of all, FIGS. 2A to 2G are cross sectional views collectively showing a method of forming a bump electrode according to a first embodiment of the present invention. In the first step, a pad electrode 1 made of, for example, Al is formed on an insulating layer 12 covering a semiconductor substrate 3, followed by depositing an insulating protective film 2 over the entire surface, as shown in FIG. 2A. Then, that portion of the insulating protective film 2 which is positioned on the pad electrode 1 is selectively etched to form an opening exposing the pad electrode 1 to the outside. After the etching step, a Ti film 7a having a thickness of, for example, 100 nm and a Ni film 7b having a thickness of, for example, 300 nm are successively formed on the entire surface by a sputtering method.

Figure 2B:
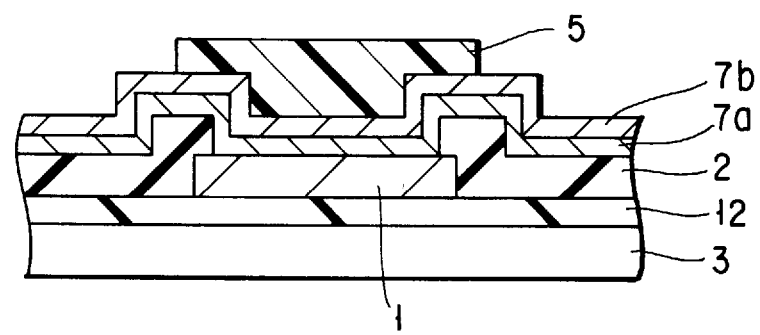
Figure 2C:
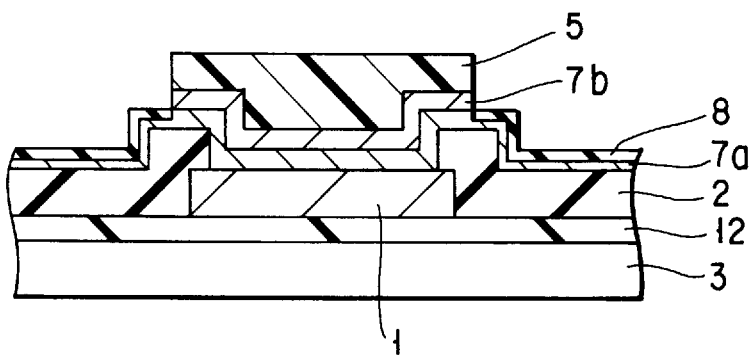

In the next step, the Ni film 7b is coated with a resist layer 5, followed by removing that portion of the resist layer 5 which is not positioned above the pad electrode 1, as shown in FIG. 2B. Then, the Ni film 7b is etched, as shown in FIG. 2C, using the resist layer 5 as a mask. In this etching step, a reversed aqua regia containing HCl and HNO$_3$ in a ratio of about 1:3 or aqua regia is used as an etching solution. In this etching step, the surface of the Ti film 7a is oxidized to form a natural oxide film 8.

Figure 2D:
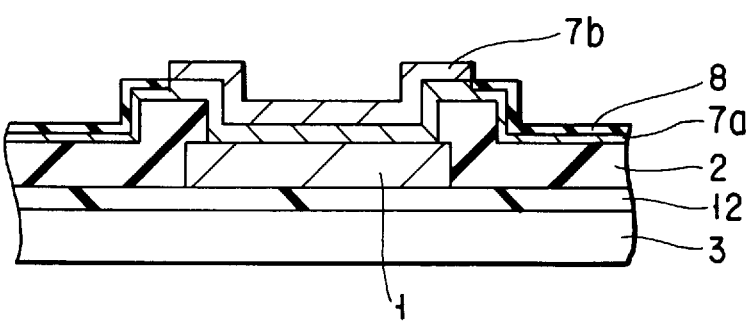
Figure 2E:
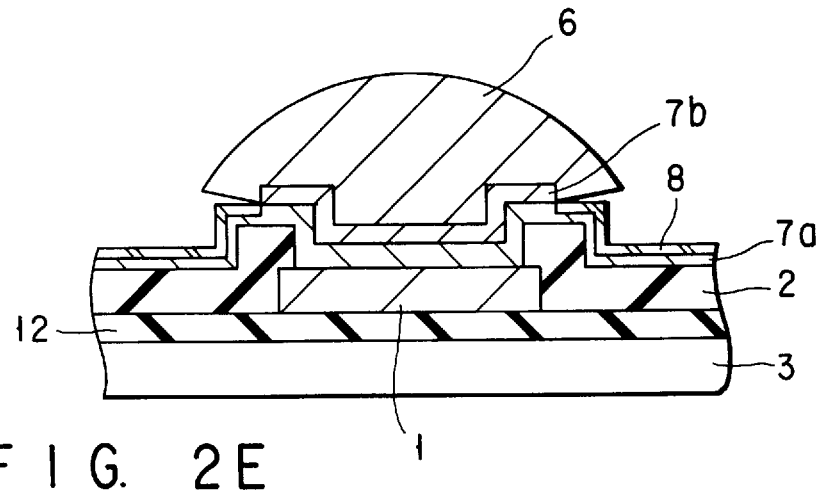
Figure 2F:
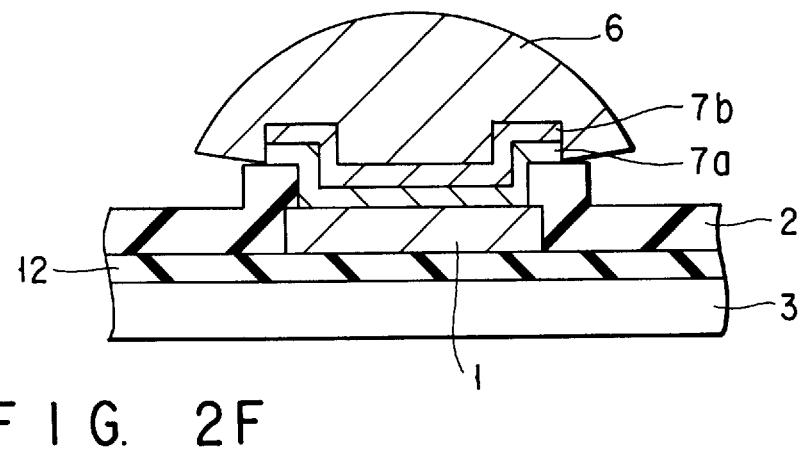

Then, the resist layer 5 is removed, as shown in FIG. 2D, followed by applying an electroplating using the Ti layer 7a as a cathode so as to form a solder bump 6, as shown in FIG. 2E. As seen from the drawing, the surface of the Ti layer 7a is covered with the oxide film 8, with the result that the solder bump does not extend to cover the oxide film 8 in the electroplating step. In other words, the solder bump 6 is formed selectively on the Ni layer 7b positioned above the pad electrode 1.

In the next step, the Ti layer 7a is removed by wet etching with the solder bump 6 used as a mask, as shown in FIG. 2E.

Figure 2G:
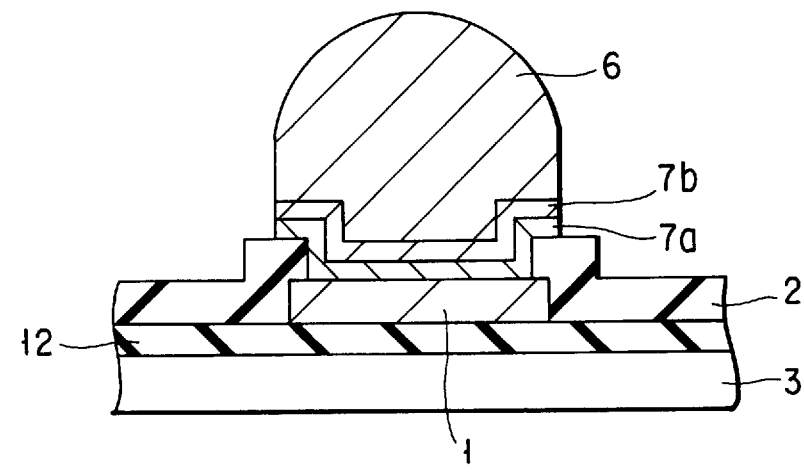

A mixed solution containing, for example, NH$_4$OH, H$_2$O$_2$ and H$_2$ is used as the wet etching solution in this step. In this stage, the solder bump 6 is shaped like a mushroom. Finally, a reflow treatment is applied to the solder bump 6, with the result that the solder bump 6 is made hemispherical, as shown in FIG. 2G.

In the above embodiment, a Pd or Pt layer may be formed on the Ni layer 7b and may be etched using the resist layer 5 as a mask.

In the embodiment shown in FIGS. 2A to 2G, the resist layer 5 is removed before the electroplating step for forming the solder bump 6. Naturally, the plating bath is not contaminated with the impurities derived from the resist layer 5. Also, after formation of the solder bump 6, it suffices to employ a wet etching with a mixture of NH$_4$OH, H$_2$O$_2$, etc., with the result that Pb and Sn constituting the main components of the solder are not corroded by the etching solution exhibiting an oxidizing power. It follows that it is possible to suppress markedly the damage done to the solder bump in the etching step of the metal layer.

FIGS. 3A to 3C are cross sectional views collectively showing the steps of forming a bump electrode according to a second embodiment of the present invention. Throughout FIGS. 2 and 3, the same reference numerals are put to the same members of the semiconductor device so as to omit the overlapping description.

In the second embodiment, the pad electrode 1 is formed on the insulating film 12 covering the semiconductor substrate 3, followed by depositing the insulating protective film 2 on the entire surface and subsequently forming an opening in that portion of the protective film 2 which is positioned on the pad electrode 1 so as to expose the pad electrode 1 to the outside, as in the first embodiment. Then, the Ti layer 7a and the Ni layer 7b are formed to cover the exposed pad electrode 1, followed by coating the entire surface including the Ni layer 7b with a resist layer 5 and subsequently removing that portion of the resist layer 5 which is positioned outside the pad electrode 1 by lithography technology, so as to form the structure shown in FIG. 3A.

Then, the Ni film 7b is etched, as shown in FIG. 3C, using the resist layer 5 as a mask. In this etching step, a reversed aqua regia containing HCl and HNO$_3$ in a ratio of about 1:3 or aqua regia is used as an etching solution. In this etching step, the surface of the Ti film 7a is oxidized to form a natural oxide film 8. Further, the resist layer 5 is removed by means of, for example, irradiation with an O$_2$ plasma for 90 to 100 minutes, as shown in FIG. 3C. In this step, a strong oxide layer 9 is formed on the surface of the Ti layer 7a.

The subsequent steps are equal to those in the first embodiment. Specifically, a solder bump is formed by means of an electroplating using the Ti film 7a as a cathode. In this plating step, a solder layer is not precipitated above the Ti film 7a because the oxide film 9 is positioned to cover the Ti film 7a. In other words, the solder layer is precipitated selectively on the Ni film 7b positioned above the pad electrode 1.

In the next step, the Ti film 7a is removed by a wet etching using the resultant solder bump as a mask. In this step, the solder bump is shaped like a mushroom, as in FIG. 2F. In the subsequent step, a reflow treatment is applied to the solder bump so as to make the solder bump shaped hemispherical.

Also in the above embodiment, a Pd or Pt layer may be formed on the Ni layer 7b and may be etched using the resist layer 5 as a mask.

In the second embodiment described above, the titanium oxide film 9 firmer than the oxide film 8 in the first embodiment is formed on the Ti film 7a. As a result, it is possible to prevent completely a so-called "selectivity failure", i.e., the phenomenon that the solder layer is formed to cover partly the titanium oxide film 9 in the solder plating step.

Also, the electroplating treatment for forming the solder bump is applied after removal of the resist layer 5, as in the first embodiment, with the result that the plating bath is not contaminated with the impurities derived from the resist layer 5. Further, after formation of the solder bump, it suffices to remove the Ti layer by means of a wet etching, making it possible to suppress markedly the damage done to the solder bump, as already pointed out in conjunction with the first embodiment.

Further, in the $O_2$ plasma asher step in the second embodiment, the resist layer is removed and, at the same time, the firm oxide film 9 is formed. Alternatively, it is possible to expose the Ti film 7a to an etching solution exhibiting a strong oxidizing power and, then, to an $O_2$ atmosphere to form the oxide film 9 before the electroplating step.

FIGS. 4A to 4F are cross sectional views collectively showing the steps of forming a bump electrode according to a third embodiment of the present invention. Throughout FIGS. 2 and 4, the same reference numerals are put to the same members of the semiconductor device so as to omit the overlapping description.

In the third embodiment, the pad electrode 1 is formed on the insulating film 12 covering the semiconductor substrate 3, followed by depositing the insulating protective film 2 on the entire surface and subsequently forming an opening by photolithography technique in that portion of the protective film 2 which is positioned on the pad electrode 1 so as to expose the pad electrode 1 to the outside, as in the first embodiment. Then, a Ti film 10a having a thickness of, for example, 100 nm, a Ni film 10b having a thickness of, for example, 300 nm, and a Pd film 10c having a thickness of, for example, 50 nm are successively deposited on the entire surface by means of a sputtering technique so as to form the structure shown in FIG. 4A.

Figure 4D:
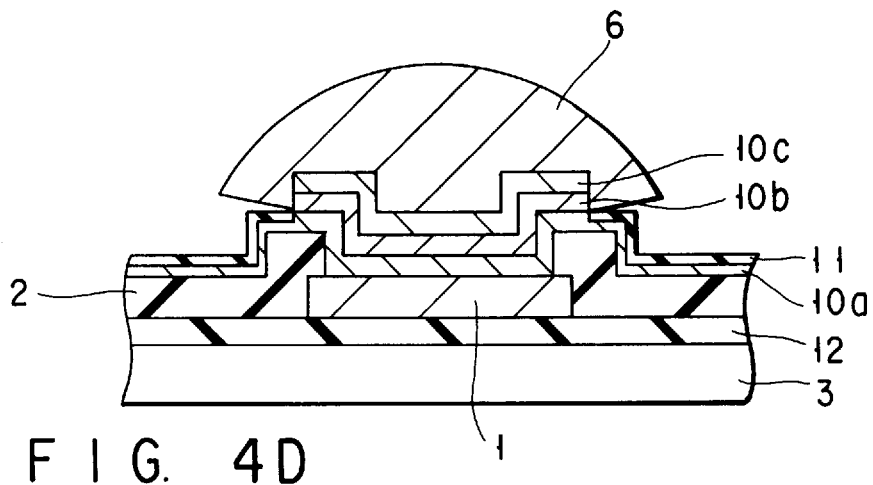
Figure 4E:
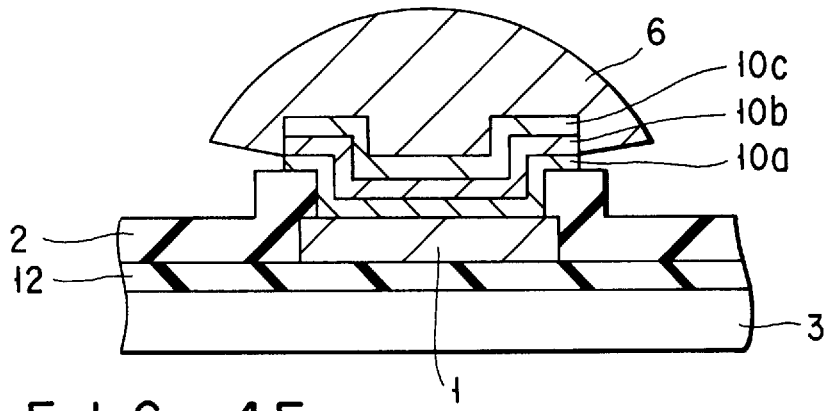

Then, the Pd film 10c is coated with the resist layer 5, followed by removing that portion of the resist layer 5 which is not positioned above the pad electrode 1 by photolithography technique, as shown in FIG. 4B. After the selective removal of the resist layer 5, the Pd film 10c and the Ni film 10b are selectively removed by etching using an etching solution of a reversed aqua regia type, as shown in FIG. 4C. In this etching step, the resist layer 5 is used as a mask. In this case, the surface of the Ti film 10a is oxidized with the etching solution to form an oxide film 11. Further, the resist layer 5 is removed, followed by forming the solder bump 6 by means of an electroplating, as shown in FIG. 4D. The Ti layer 10a is used as a cathode in this electroplating step. It should be noted that the surface of the Ti film 10a is covered with the oxide film 11, with the result that the solder layer is not formed on the oxide film 11. In other words, the solder bump 6 is formed selectively on the Pd film 10c positioned above the pad electrode 1.

Figure 4F:
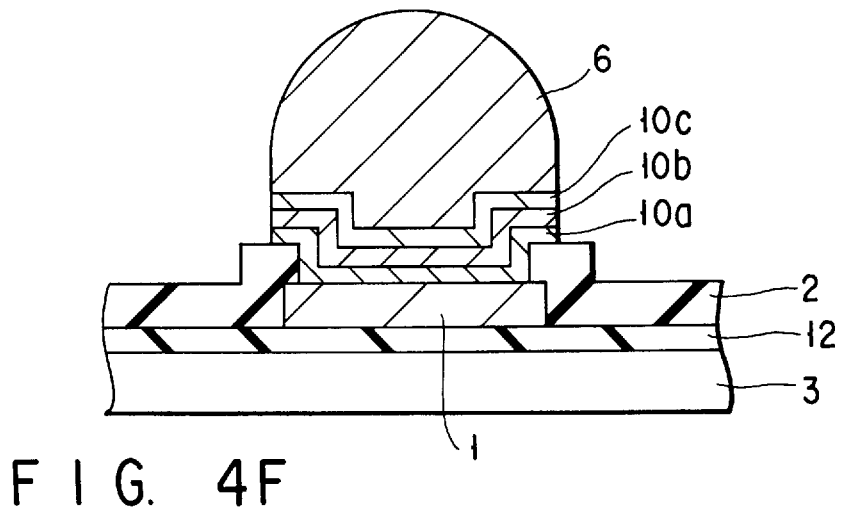

In the next step, the Ti film 10a is removed by a wet etching using the resultant solder bump 6 as a mask. In this step, the solder bump is shaped like a mushroom, as in FIG. 4E. In the subsequent step, a reflow treatment is applied to the solder bump so as to make the solder bump shaped hemispherical, as shown in FIG. 4F.

In the third embodiment shown in FIG. 4, the electroplating treatment for forming the solder bump is applied after removal of the resist layer 5, as in the first embodiment, with the result that the plating bath is not contaminated with the impurities derived from the resist layer 5. Further, in the step of removing the metal layer 10 by etching, it is possible to suppress markedly the damage done to the solder bump, as already pointed out in conjunction with the first embodiment.

FIGS. 5A to 5C are cross sectional views collectively showing the steps of forming a bump electrode according to a fourth embodiment of the present invention. Throughout FIGS. 2 and 5, the same reference numerals are put to the same members of the semiconductor device so as to omit the overlapping description. In this fourth embodiment, the solder bump is formed by a printing method.

In the fourth embodiment, the pad electrode 1 is formed on the insulating film 12 covering the semiconductor substrate 3, followed by depositing the insulating protective film 2 on the entire surface and subsequently forming an opening by photolithography technique in that portion of the protective film 2 which is positioned on the pad electrode 1 so as to expose the pad electrode 1 to the outside, as in the first embodiment. Then, the Ti film 10a, the Ni film 10b, and the Pd film 10c are successively deposited on the entire surface by means of a sputtering technique. Then, the Pd film 10c is coated with the resist layer 5, followed by removing that portion of the resist layer 5 which is not positioned above the pad electrode 1 by photolithography technique. Further, the Pd film 10c and the Ni film 10b are selectively removed by etching using a mixed etching solution containing, for example, HCl, $HNO_3$ and $H_2O$ so as to obtain the structure shown in FIG. 5A.

In the next step, the resist layer 5 is removed, followed by applying a solder paste on the Pd film 10c by a printing method, followed by curing the solder paste, and thus forming a solder bump 13, as shown in FIG. 5B. Further, the Ti film 10a is removed by wet etching using a mixed etching solution containing, for example, $HN_4OH$, $H_2O_2$, and $H_2O$, as shown in FIG. 5C. In this etching step, the solder bump 13 is used as a mask.

After removal of the Ti film 10a, a reflow treatment is applied to the solder bump 13. It should be noted that some deviation in the position of the solder bump 13 formed previously by the printing method is corrected in this reflow treating step. Specifically, that portion of the solder layer which is positioned outside the Pd film 10c is moved during the reflow treatment because of the surface tension of the molten solder and a good wettability between the molten solder and the Pd film 10c, with the result that the resultant solder bump 13 is positioned accurately on the Pd film 10c.

In the fourth embodiment described above, the metal layers 10b and 10c are removed by etching before formation of the solder bump. It follows that the damage done to the solder bump by an etching treatment can be markedly suppressed. Further, since the solder bump is formed by a printing method, which is simple and adapted for mass production, the solder bump can be formed easily with a low cost.

Figure 6A:
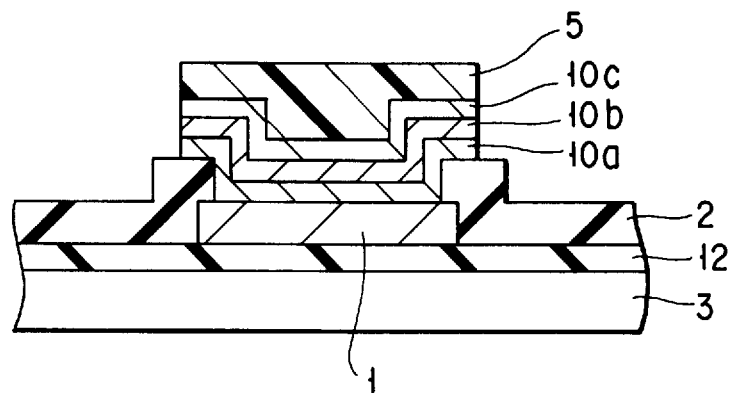
FIGS. 6A and 6B are cross sectional views collectively showing a method of forming a bump electrode according to a fifth embodiment of the present invention.
Figure 6B:
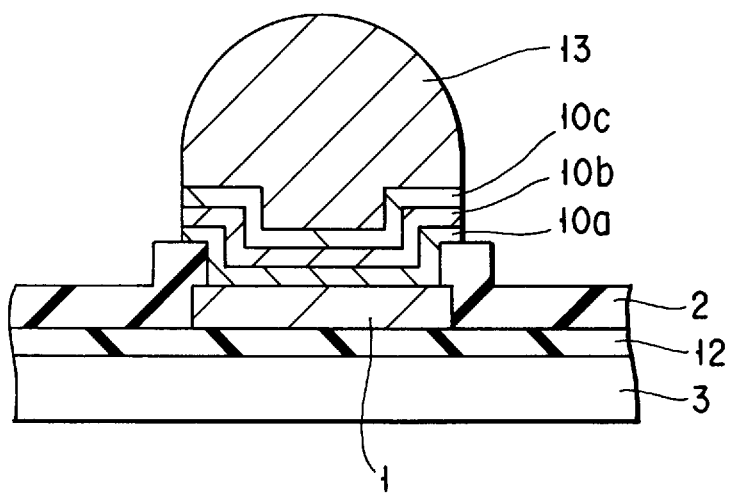

FIGS. 6A to 6C are cross sectional views collectively showing the steps of forming a bump electrode according to a fifth embodiment of the present invention. Throughout FIGS. 2 and 6, the same reference numerals are put to the same members of the semiconductor device so as to omit the overlapping description. In this fifth embodiment, the solder bump is formed by a printing method, as in the fourth embodiment.

In the fifth embodiment, the pad electrode 1 is formed on the insulating film 12 covering the semiconductor substrate 3, followed by depositing the insulating protective film 2 on the entire surface and subsequently forming by etching an opening in that portion of the protective film 2 which is positioned on the pad electrode 1 so as to expose the pad electrode 1 to the outside, as in the first embodiment. Then, the Ti film 10a, the Ni film 10b, and the Pd film 10c are successively deposited on the entire surface by means of a sputtering technique. Then, the Pd film 10c is coated with the resist layer 5, followed by removing that portion of the resist layer 5 which is not positioned above the pad electrode 1 by photolithography technique. Further, the Pd film 10c and the Ni film 10b are selectively removed by etching using a mixed etching solution containing, for example, HCl, $HNO_3$ and $H_2O$. Still further, the Ti film 10a is removed by a wet etching using a mixed etching solution containing, for example, $HN_4OH$, $H_2O_2$, and $H_2O$ so as to obtain the structure shown in FIG. 6A.

In the next step, the resist layer 5 is removed, followed by applying a solder paste on the Pd film 10c by a printing method, followed by curing the solder paste, and thus forming a solder bump 13, as shown in FIG. 6B. Then, a reflow treatment is applied to the solder bump 13. It should be noted that some deviation in the position of the solder bump 13 formed previously by the printing method is corrected in this reflow treating step. Specifically, that portion of the solder layer which is positioned outside the Pd film 10c is moved during the reflow treatment because of the surface tension of the molten solder and a good wettability between the molten solder and the Pd film 10c, with the result that the resultant solder bump 13 is positioned accurately on the Pd film 10c.

In the fifth embodiment described above, the metal layers 10a, 10b and 10c are removed by etching before formation of the solder bump. It follows that the damage done to the solder bump by an etching treatment can be markedly suppressed. Further, since the solder bump is formed by a printing method, which is simple and adapted for mass production, the solder bump can be formed easily with a low cost.

As described above in detail, an electroplating treatment is applied in the present invention after removal of a resist layer. As a result, the composition of the plating bath can be maintained easily as desired. In addition, it is possible to prolong the life of the plating bath. It should also be noted that, in the present invention, an etching with an etching solution exhibiting a strong oxidizing power is not employed after formation of the solder bump, making it possible to suppress markedly the damage done to the solder bump in the step of a wet etching. It follows that it is possible to improve the yield and reliability of the semiconductor device.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising the steps of:

forming a pad electrode on an insulating film covering a semiconductor substrate;

forming a first metal layer on said pad electrode, said first metal layer being capable of forming a strong adhesive bond with the pad layer, followed by forming a second metal layer on said first metal layer, said second metal layer acting as a barrier layer and being capable of forming a strong adhesive bond with a solder;

forming a resist pattern on the second metal layer in a manner to cover that region which corresponds to the pad electrode;

selectively etching the second metal layer using said resist pattern as a mask;

removing the resist pattern;

forming a solder layer selectively on the second metal layer; and selectively etching the first metal layer using said solder layer as a mask.

2. The method according to claim 1, wherein said first metal layer is formed of Ti.

3. The method according to claim 1, wherein said second metal layer is formed of a metal selected from the group consisting of Ni and Cu.

4. The method according to claim 1, wherein said second metal layer is of a laminate structure consisting of a first sub-layer formed of a metal selected from the group consisting of Ni and Cu, and a second sub-layer formed of a metal selected from the group consisting of Pd, Pt, and Au.

5. The method according to claim 1, wherein said solder layer is selectively formed on said second metal layer by an electroplating method.

6. The method according to claim 1, wherein said resist layer is removed by using an oxygen plasma.

7. The method according to claim 1, further comprising the step of oxidizing said first metal layer within an oxygen atmosphere, said oxidizing step being interposed between the step of etching said second metal layer and the step of selectively forming said solder layer.

8. The method according to claim 1, wherein said solder layer is formed into a spherical shape.

9. A method of manufacturing a semiconductor device, comprising the steps of:

forming a pad electrode on an insulating film covering a semiconductor substrate;

forming a first metal layer on said pad electrode, said first metal layer being capable of forming a strong adhesive bond with the pad layer, followed by forming a second metal layer on said first metal layer, said second metal layer acting as a barrier layer and being capable of forming a strong adhesive bond with a solder;

forming a resist pattern on the second metal layer in a manner to cover that region which corresponds to the pad electrode;

successively etching the second metal layer and the first metal layer using said resist pattern as a mask;

removing the resist pattern; and selectively forming a solder layer on the second metal layer.

10. The method according to claim 9, wherein an electroless plating is employed for selectively forming said solder layer on said second metal layer.

11. The method according to claim 9, wherein said solder layer is formed into a spherical shape.

12. A method of manufacturing a semiconductor device, comprising the steps of:

forming a pad electrode on an insulating film covering a semiconductor substrate;

forming a first metal layer on said pad electrode, said first metal layer being capable of forming a strong adhesive bond with the pad layer, followed by forming a second metal layer on said first metal layer, said second metal layer acting as a barrier layer and being capable of forming a strong adhesive bond with a solder;

forming a resist pattern on the second metal layer in a manner to cover that region which corresponds to the pad electrode;

selectively etching the second metal layer using said resist pattern as a mask;

removing the resist pattern;

forming a solder layer selectively on the second metal layer by means of a printing method; and selectively etching the first metal layer using the solder layer as a mask.

13. The method according to claim 12, wherein said first metal layer is formed of Ti.

14. The method according to claim 12, wherein said second metal layer is formed of a metal selected from the group consisting of Ni and Cu.

15. The method according to claim 12, wherein said second metal layer is of a laminate structure consisting of a first sub-layer formed of a metal selected from the group consisting of Ni and Cu and a second sub-layer formed of a metal selected from the group consisting of Pd, Pt, and Au.

16. The method according to claim 12, wherein said resist layer is removed by using an oxygen plasma.

17. The method according to claim 12, wherein said solder layer is formed into a spherical shape.

18. A method of manufacturing a semiconductor device, comprising the steps of:

forming a pad electrode on an insulating film covering a semiconductor substrate;

forming a first metal layer on said pad electrode, said first metal layer being capable of forming a strong adhesive bond with the pad layer, followed by forming a second metal layer on said first metal layer, said second metal layer acting as a barrier layer and being capable of forming a strong adhesive bond with a solder;

forming a resist pattern on the second metal layer in a manner to cover that region which corresponds to the pad electrode;

successively etching the second metal layer and the first metal layer using said resist pattern as a mask;

removing the resist pattern; and forming a solder layer selectively on the second metal layer by means of a printing method.

19. The method according to claim 18, wherein said first metal layer is formed of Ti.

20. The method according to claim 18, wherein said second metal layer is formed of a metal selected from the group consisting of Ni and Cu.

21. The method according to claim 18, wherein said second metal layer is of a laminate structure consisting of a first sub-layer formed of a metal selected from the group consisting of Ni and Cu and a second sub-layer formed of a metal selected from the group consisting of Pd, Pt, and Au.

22. The method according to claim 18, wherein said resist layer is removed by using an oxygen plasma.

23. The method according to claim 18, wherein said solder layer is formed into a spherical shape.

* * * * *